United States Patent
Wang

(10) Patent No.: US 11,437,577 B2
(45) Date of Patent: Sep. 6, 2022

(54) ORGANIC LIGHT EMITTING DIODE DISPLAY DEVICE AND METHOD OF FABRICATING SAME

(71) Applicant: Shenzhen China Star Optoelectronics Semiconductor Display Technology Co., Ltd., Shenzhen (CN)

(72) Inventor: Shipan Wang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/615,838

(22) PCT Filed: Oct. 11, 2019

(86) PCT No.: PCT/CN2019/110558
§ 371 (c)(1),
(2) Date: Nov. 22, 2019

(87) PCT Pub. No.: WO2021/012405
PCT Pub. Date: Jan. 28, 2021

(65) Prior Publication Data
US 2022/0140240 A1    May 5, 2022

(30) Foreign Application Priority Data
Jul. 22, 2019    (CN) .......................... 201910659573.8

(51) Int. Cl.
*H01L 51/00* (2006.01)
*H01L 51/50* (2006.01)

(52) U.S. Cl.
CPC ...... *H01L 51/0007* (2013.01); *H01L 51/0056* (2013.01); *H01L 51/5072* (2013.01); *H01L 2251/558* (2013.01)

(58) Field of Classification Search
CPC .................................................... H01L 51/0072
See application file for complete search history.

(56) References Cited

U.S. PATENT DOCUMENTS

| | | |
|---|---|---|
| 2017/0179395 A1 | 6/2017 | Kim et al. |
| 2018/0291263 A1 | 10/2018 | Pan |
| 2018/0323407 A1 | 11/2018 | Jiang |
| 2021/0036240 A1* | 2/2021 | So ........................... H01L 51/50 |

FOREIGN PATENT DOCUMENTS

| | | |
|---|---|---|
| CN | 106905220 A | 6/2017 |
| CN | 106910831 A | 6/2017 |
| CN | 106981588 A | 7/2017 |
| CN | 107623076 A | 1/2018 |
| CN | 108475735 A | 8/2018 |
| CN | 109825129 A | 5/2019 |
| CN | 110311050 A | 10/2019 |

* cited by examiner

*Primary Examiner* — Yu-Hsi D Sun
(74) *Attorney, Agent, or Firm* — Nathan & Associates; Menachem Nathan

(57) ABSTRACT

An organic light emitting diode display device and a method of fabricating same are provided. The organic light emitting diode display includes an electron transport layer disposed on a light emitting layer, and material of the electron transport layer comprises a soluble organic electron transport material. The electron transport layer can be formed by ink and by inkjet printing.

8 Claims, 2 Drawing Sheets

ORGANIC LIGHT EMITTING DIODE DISPLAY DEVICE AND METHOD OF FABRICATING SAME

FIELD OF INVENTION

The present disclosure relates to the field of display panel technologies, and more particularly to an organic light emitting diode display device and a method of fabricating same.

BACKGROUND OF INVENTION

Organic light emitting diodes (OLED) have been widely used in flat panel display devices due to their advantages of high contrast, large viewing angles, fast response speed, light and thin flexibility.

At present, small-sized OLED products adopt vacuum evaporation and fine reticle technology to realize RGB three-color display, which has become mature, but large-size OLED products have severe warpage and deformation due to the size of the reticle, which increases the difficulty of alignment, resulting in low yields that have been abandoned. At present, large-size color display is generally realized by white light and color filter technology, but vacuum evaporation white light adopts multi-layer structure, which faces complicated equipment and process, high energy consumption, and large material waste. The high cost and other shortcomings, the printed OLED technology configures the organic functional material into ink and realizes the maximum utilization of the material through solution processing technology such as screen printing or inkjet printing, and does not require a fine metal reticle, which can effectively reduce the cost in preparation. It has great advantages in the preparation of large-size OLED panels.

At present, a hole injection layer, a hole transport layer, and a light emitting layer in a solution processing type OLED can be prepared by inkjet printing, and the electron transport layer and a cathode are still the evaporation process, in order to further reduce the cost of materials and equipment, it is urgent to develop full-printing process technology, but the electron transport layer and cathode are still difficult to prepare by printing to obtain high-performance OLED devices. This is because most of the electron transport layer materials are organic solvent-dissolved materials. When they are configured as inks, they are easily miscible with the light emitting layer, causing damage to the light emitting layer by ink of the printed electron transport layer. The cathode is a metal material. Although there is silver paste, the nano silver ink can form a conductive cathode, but the damage of the solvent to a lower layer cannot be completely avoided, so the device preparation of the full printing process still has difficulty.

SUMMARY OF INVENTION

An object of an embodiment of the present invention is to provide an organic light emitting diode (OLED) display device and a method of fabricating the same that can solve issues in the prior art.

In order to solve the above issues, embodiments of the present invention provide an organic light emitting diode display device and a method for fabricating the same. A hole injection layer, a hole transport layer, a light emitting layer and an electron transport layer are sequentially prepared by printing on a substrate. A soluble organic electron transport material is used. An ink is configurable by a specific solvent. Since the specific solvent used is a polar mixed solvent containing a polyol, it has characteristics of not damaging the light emitting layer, and thus device performance comparable to that of the vapor-deposited electron transport layer can be obtained.

An embodiment of the present disclosure provides an organic light emitting diode display device. The organic light emitting diode display device includes a substrate, an anode layer disposed on the substrate, a hole injection layer disposed on the anode layer, a hole transport layer disposed on the hole injection layer, a light emitting layer disposed on the hole transport layer, and an electron transport layer disposed on the light emitting layer. Material of the electron transport layer includes a soluble organic electron transport material.

In an embodiment of the present disclosure, the soluble organic electron transport material is an organic small molecule electron transport material.

In an embodiment of the present disclosure, the electron transport layer is formed by ink and by ink printing.

In an embodiment of the present disclosure, the ink is configured by dissolving the soluble organic electron transport material using a polar mixed solvent.

In an embodiment of the present disclosure, the polar mixed solvent comprises a first solvent and a second solvent.

In an embodiment of the present disclosure, the first solvent is a polyol, and a content of the first solvent ranges from 70% by weight to 99.5% by weight.

In an embodiment of the present disclosure, the second solvent is at least one of a phenol, a ketone, an ether, an ester, an amide, and a combination thereof, and the content of the second solvent ranges from 0% by weight to 30% by weight.

In an embodiment of the present disclosure, a structural formula of the organic small molecule electron transport material is

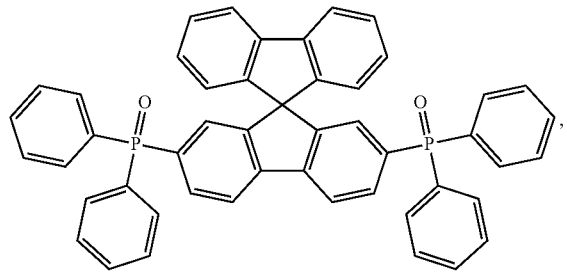 [SMILES: O=P(c1ccccc1)(c1ccccc1)c1ccc2c(c1)C1(c3ccccc3-c3ccccc31)c1cc(P(=O)(c3ccccc3)c3ccccc3)ccc1-2]

a chemical formula of the organic small molecule electron transport material is $C_{49}H_{34}O_2P_2$.

In an embodiment of the present disclosure, a film thickness of the electron transport layer ranges from 1 nm to 100 nm.

In an embodiment of the present disclosure, the organic light emitting diode display device further includes an electron injection layer disposed on the electron transport layer and a cathode layer disposed on the electron injection layer.

An embodiment of the present disclosure further provides a method of fabricating an organic light emitting diode display device. The method includes providing a substrate, forming an anode layer on the substrate by magnetron sputtering, forming a hole injection layer on the anode layer by inkjet printing, forming a hole transport layer in the hole injection layer by inkjet printing, forming a light emitting layer on the hole transport layer by inkjet printing, and forming an electron transport layer on the light emitting layer by ink and by inkjet printing. Material of the electron transport layer includes a soluble organic electron transport material.

In an embodiment of the present disclosure, the ink is configured by dissolving the soluble organic electron transport material using a polar mixed solvent.

In an embodiment of the present disclosure, after forming the electron transport layer, the method further comprises placing the substrate on which the electron transport layer is formed in a vacuum chamber and forming an electron injection layer and a cathode layer by evaporation.

Beneficial effects of an embodiment of the present disclosure are that, the OLED display device and a method of fabricating of the same have advantages that the electron transport layer adopts the soluble organic electron transport material and is configured to be a printable ink by using a specific solvent, since the specific solvent used is a polyhydric alcohol-containing electrode. The organic solvent mixture has characteristics of not damaging the light emitting layer, so that the device performance equivalent to the vapor-deposited electron transport layer can be obtained, so that the organic electron transport layer can be prepared by printing to further reduce the material and process cost.

DETAILED DESCRIPTION OF PREFERRED EMBODIMENTS

The following description of the various embodiments is provided to illustrate the specific embodiments of the invention.

Figure 1:
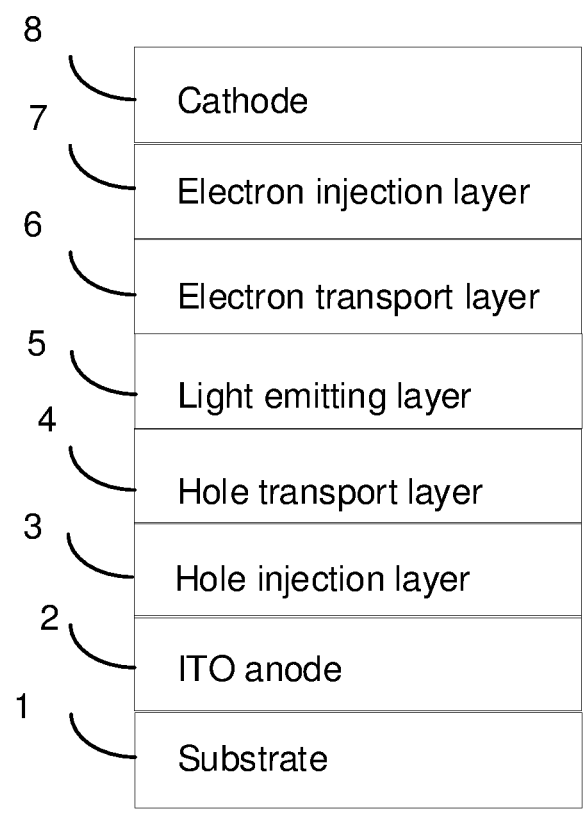
FIG. 1 is a schematic structural diagram of an organic light emitting diode display device according to an embodiment of the present invention.

As shown in FIG. 1, an embodiment of the present invention provides an organic light emitting diode display device including a substrate 1, an anode layer 2, a hole injection layer 3, a hole transport layer 4, a light emitting layer 5, an electron transport layer 6, an electron injection layer 7, and a cathode layer 8.

The anode layer is disposed on the substrate 1, and the anode layer 2 has a film thickness of between 20 nm and 200 nm. The material of the anode layer 2 is a high work function transparent metal oxide, and an anode layer is formed by magnetron sputtering.

In one embodiment, material of the anode layer 2 is indium tin oxide, and the anode layer 2 has a film thickness of 70 nm.

The hole injection layer 3 is provided on the anode layer 2, and the hole injection layer 3 has a film thickness of between 1 nm and 200 nm. The material of the hole injection layer 3 is an organic small molecule or a polymer hole injection material. In one embodiment, the hole injection layer material is a polymer of a 3,4-ethylenedioxythiophene monomer having a film thickness of 40 nm.

The hole transport layer 4 is provided on the hole injection layer 3, and the hole transport layer 4 has a film thickness of between 1 nm and 100 nm. The material of the hole transport layer 4 is an organic small molecule or a polymer hole transport material. In one embodiment, the material of the hole transport layer 4 is polyvinyl carbazole, and the hole transport layer 4 has a film thickness of 20 nm.

The light emitting layer 5 is disposed on the hole transport layer 4, and the light emitting layer 5 has a film thickness of between 1 nm and 200 nm. The material of the light emitting layer 5 is an organic small molecule, polymer fluorescent material, a phosphorescent material, or a thermally activated delayed fluorescent (TADF) material. In one embodiment, material of the light emitting layer 5 is a phosphorescent material. A host material of the phosphorescent material is polyvinyl carbazole and 2,2'-(1,3-phenyl) bis [5-(4)-tert-Butylphenyl)-1,3,4-oxadiazole]. A luminescent material of the phosphorescent material is tris(2-phenylpyridine) ruthenium, and the phosphorescent material has a film thickness of 60 nm.

The electron transport layer 6 is disposed on the light emitting layer 5, and the electron transport layer 6 has a film thickness of between 1 nm and 100 nm. The material of the electron transport layer 6 is an organic small molecule electron transport material.

In one embodiment, the small organic electron transport material is 2,7-bis(diphenylphosphinyl)-9,9'-spirobifluorene. The organic small molecule electron transport material has a chemical formula of C49H34O2P2. The electron transport layer 6 is prepared by ink and by ink printing. The ink is configured by dissolving the soluble organic electron transport material using a polar mixed solvent. The polar mixed solvent is a mixed solvent of methanol and ethylene glycol, wherein the proportion of methanol is 15%. In the preparation of the electron transport layer, the ink concentration was 2.5% by weight. Further, the formed electron transport layer 6 had a film thickness of 20 nm.

The electron injection layer 7 is disposed on the electron transport layer 6, and the electron injection layer 7 has a film thickness of between 0.5 nm and 10 nm. The material of the electron injection layer 7 is an alkali metal and a salt thereof, or an alkaline earth metal and a salt thereof, or a metal complex. In one embodiment, material of the electron injection layer 7 is lithium fluoride, and the electron injection layer 7 has a film thickness of 1 nm.

The cathode layer 8 is disposed on the electron injection layer, and the cathode layer 8 has a film thickness of between 10 nm and 200 nm. The material of the cathode layer 8 is a low work function metal material or a low work function metal alloy or a transparent metal oxide such as IZO. In one embodiment, material of the cathode layer 8 is aluminum and the cathode layer 8 has a film thickness of 150 nm.

Figure 2:
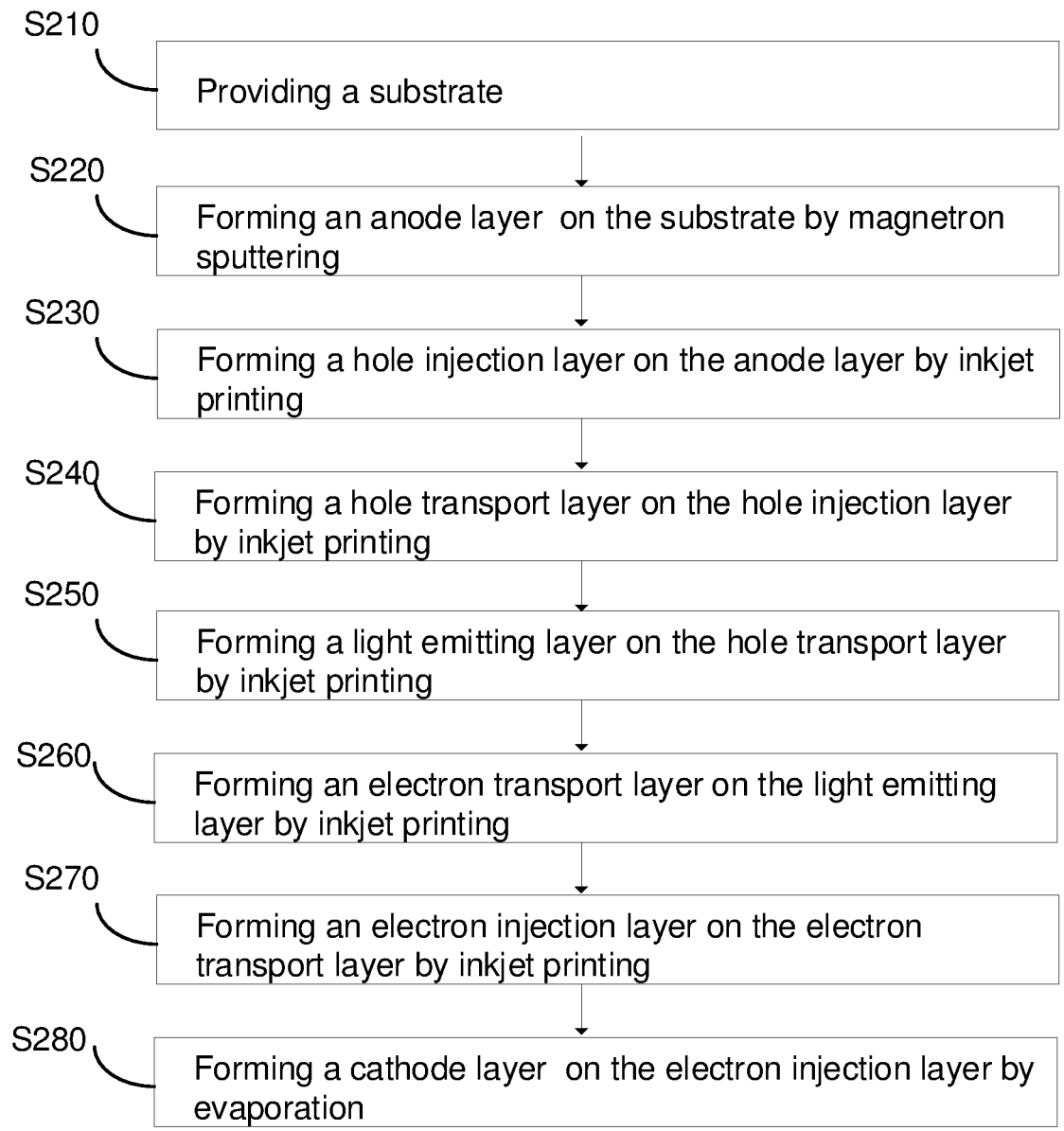
FIG. 2 is a flowchart of a method for fabricating an organic light emitting diode display device according to an embodiment of the present invention.

As shown in FIG. 2, FIG. 2 is a flowchart of a method for fabricating an organic light emitting diode display device according to an embodiment of the present invention. The method includes following steps.

Step S210: providing a substrate 1 is provided.

In one embodiment, the substrate 1 is a glass substrate.

Step S220: forming an anode layer 2 on the substrate 1 by magnetron sputtering is provided.

The anode layer 2 is a high work function transparent metal oxide, which is formed by magnetron sputtering, and has a film thickness of between 20 nm and 200 nm. In an embodiment, material of the anode layer 2 is indium tin oxide. The anode layer 2 has a film thickness of 70 nm.

Step S230: forming a hole injection layer 3 on the anode layer 2 by inkjet printing is provided.

Material of the hole injection layer 3 is an organic small molecule or a polymer hole injecting material, and the hole injection layer 3 is formed by an inkjet printing method. The hole injection layer 3 has a film thickness of between 1 nm and 200 nm. In an embodiment, the material of the hole injection layer 3 is a polymer of a 3,4-ethylenedioxythiophene monomer, and the hole injection layer 3 has a film thickness of 40 nm.

Step S240: forming a hole transport layer 4 on the hole injection layer 3 by inkjet printing is provided.

Material of the hole transport layer is an organic small molecule or a polymer hole transport material which is formed by an inkjet printing method. The hole transport layer 4 has a film thickness of between 1 nm and 100 nm. In one embodiment, the material of the hole transport layer 4 is polyvinyl carbazole, and the hole transport layer 4 has a film thickness of 20 nm.

Step S250: forming a light emitting layer 5 on the hole transport layer 4 by inkjet printing is provided.

The material of the light emitting layer 5 is an organic small molecule or a polymer fluorescent material or a phosphorescent material or a thermally activated delayed fluorescent (TADF) material, which is formed by an inkjet printing method, and the film thickness of the light emitting layer 5 is from 1 nm to 200 nm. In an embodiment, the material of the light emitting layer 5 is the phosphorescent material. The host material of the phosphorescent material is polyvinyl carbazole and 2,2'-(1,3-phenyl) bis [5-(4-tert-Butylphenyl)-1,3,4-oxadiazole]. A luminescent material of the phosphorescent material is tris(2-phenylpyridine) ruthenium, and the phosphorescent material has a film thickness of 60 nm.

Step S260: forming an electron transport layer 6 on the light emitting layer 5 by ink and by inkjet printing is provided, wherein the material of the electron transport layer 6 is a soluble organic electron transport material.

The ink is composed of a solvent and a solute, which is formed by an inkjet printing method, and the electron transport layer 6 has a film thickness of between 1 nm and 100 nm. In one embodiment, the solute (i.e., the organic small molecule electron transport material) is 2,7-bis(diphenylphosphinyl)-9,9'-spirobifluorene, as follows:

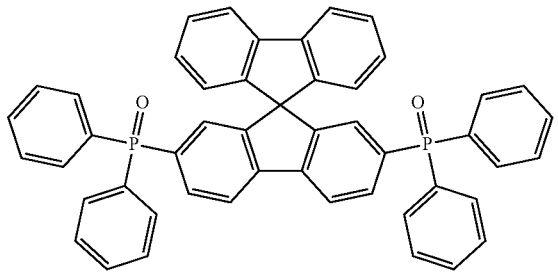 [SMILES: O=P(c1ccccc1)(c1ccccc1)c1ccc2c(c1)C1(c3ccccc3-c3ccccc31)c1cc(P(=O)(c3ccccc3)c3ccccc3)ccc1-2]

The solute has a chemical formula of C49H34O2P2, and the solvent (i.e., a polar mixed solvent) is a mixed solvent of methanol and ethylene glycol, wherein the proportion of methanol is 15%.

The electron transport layer has an ink concentration of 2.5% by weight and a film thickness of 20 nm.

Step S270: forming an electron injection layer 7 on the electron transport layer 6 by evaporation is provided.

The material of the electron injection layer 7 is an alkali metal and a salt thereof, or an alkaline earth metal and a salt thereof, or a metal complex. The electron injection layer 7 is prepared by a vacuum evaporation film forming method, and the electron injection layer 7 has a film thickness of 0.5 nm to 10 nm. In one embodiment, material of the electron injection layer 7 is lithium fluoride, and the electron injecting layer 7 has a film thickness of 1 nm.

Step S280: forming a cathode layer 8 on the electron injection layer 7 by evaporation is provided.

The material of the cathode layer 8 is a low work function metal material or a low work function metal alloy or a transparent metal oxide. It is prepared by a vacuum evaporation film forming method, and the cathode layer 8 has a film thickness of between 10 nm and 200 nm. In one example, the cathode layer 8 is made of aluminum, and the cathode layer 8 has a film thickness of 150 nm.

In the above, in embodiments of the present invention, the OLED display device and a method of fabricating of the same have advantages that the electron transport layer adopts the soluble organic electron transport material and is configured to be a printable ink by using a specific solvent, since the specific solvent used is a polyhydric alcohol-containing electrode. The organic solvent mixture has characteristics of not damaging the light emitting layer, so that the device performance equivalent to the vapor-deposited electron transport layer can be obtained, so that the organic electron transport layer can be prepared by printing to further reduce the material and process cost.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. An organic light emitting diode display device, comprising:
   a substrate;
   an anode layer disposed on the substrate;
   a hole injection layer disposed on the anode layer;
   a hole transport layer disposed on the hole injection layer;
   a light emitting layer disposed on the hole transport layer; and
   an electron transport layer disposed on the light emitting layer, wherein material of the electron transport layer comprises a soluble organic electron transport material;
   wherein the soluble organic electron transport material is an organic small molecule electron transport material;
   wherein a structural formula of the organic small molecule electron transport material

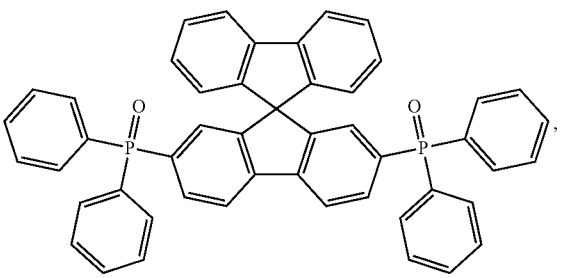 [SMILES: O=P(c1ccccc1)(c1ccccc1)c1ccc2c(c1)C1(c3ccccc3-c3ccccc31)c1cc(P(=O)(c3ccccc3)c3ccccc3)ccc1-2]

is a chemical formula of the organic small molecule electron transport material is C49H34O2P2.

2. The organic light emitting diode display device according to claim 1, wherein the electron transport layer is formed by ink and by ink printing.

3. The organic light emitting diode display device according to claim 2, wherein the ink is configured by dissolving the soluble organic electron transport material using a polar mixed solvent.

4. The organic light emitting diode display device according to claim 3, wherein the polar mixed solvent comprises a first solvent and a second solvent.

5. The organic light emitting diode display device according to claim 4, wherein the first solvent is a polyol, and a content of the first solvent ranges from 70% by weight to 99.5% by weight.

6. The organic light emitting diode display device according to claim 4, wherein the second solvent is at least one of a phenol, a ketone, an ether, an ester, and an amide, and the content of the second solvent ranges from 0% by weight to 30% by weight.

7. The organic light emitting diode display device according to claim 1, wherein a film thickness of the electron transport layer ranges from 1 nm to 100 nm.

8. The organic light emitting diode display device according to claim 1, further comprising an electron injection layer disposed on the electron transport layer and a cathode layer disposed on the electron injection layer.

\* \* \* \* \*